US012787428B2

(12) United States Patent
Xie et al.

(10) Patent No.: US 12,787,428 B2
(45) Date of Patent: Nov. 3, 2026

(54) GATE TIE-DOWN FOR TOP FIELD EFFECT TRANSISTOR

(71) Applicant: International Business Machines Corporation, Armonk, NY (US)

(72) Inventors: Ruilong Xie, Niskayuna, NY (US); Julien Frougier, Albany, NY (US); Min Gyu Sung, Latham, NY (US); Chanro Park, Clifton Park, NY (US); Juntao Li, Cohoes, NY (US)

(73) Assignee: International Business Machines Corporation, Armonk, NY (US)

( * ) Notice: Subject to any disclaimer, the term of this patent is extended or adjusted under 35 U.S.C. 154(b) by 187 days.

(21) Appl. No.: 18/068,570

(22) Filed: Dec. 20, 2022

(65) Prior Publication Data

US 2024/0203992 A1 Jun. 20, 2024

(51) Int. Cl.

| | |
|---|---|
| ***H01L 27/092*** | (2006.01) |
| ***H01L 21/822*** | (2006.01) |
| ***H01L 21/8238*** | (2006.01) |
| ***H01L 23/528*** | (2006.01) |
| ***H01L 29/06*** | (2006.01) |
| ***H01L 29/423*** | (2006.01) |
| ***H01L 29/66*** | (2006.01) |
| ***H01L 29/775*** | (2006.01) |
| ***H10D 30/01*** | (2025.01) |
| ***H10D 30/43*** | (2025.01) |
| ***H10D 30/67*** | (2025.01) |
| ***H10D 62/10*** | (2025.01) |
| ***H10D 84/01*** | (2025.01) |
| ***H10D 84/03*** | (2025.01) |

(Continued)

(52) U.S. Cl.
CPC ......... *H10D 84/856* (2025.01); *H10D 30/014* (2025.01); *H10D 30/43* (2025.01); *H10D 30/6735* (2025.01); *H10D 62/121* (2025.01); *H10D 84/0167* (2025.01); *H10D 84/0186* (2025.01); *H10D 84/0188* (2025.01); *H10D 84/038* (2025.01); *H10D 88/01* (2025.01); *H10W 20/427* (2026.01)

(58) Field of Classification Search
CPC .... H10D 30/014; H10D 30/024; H10D 30/43; H10D 30/62; H10D 30/6211; H10D 30/6212; H10D 30/6213; H10D 30/6735; H10D 30/6757; H10D 62/118; H10D 62/119; H10D 62/121; H10D 84/0158; H10D 84/0188; H10D 84/0467; H10D 84/0193; H10D 84/038; H10D 84/834; H10D 84/853; H10D 84/856; H10D 87/00; H10W 20/427
See application file for complete search history.

(56) References Cited

U.S. PATENT DOCUMENTS

| | | | |
|---|---|---|---|
| 9,455,254 | B2 | 9/2016 | Xie et al. |
| 9,570,573 | B1 | 2/2017 | Fan et al. |

(Continued)

*Primary Examiner* — David C Spalla
(74) *Attorney, Agent, or Firm* — Cantor Colburn LLP; Kristofer Haggerty

(57) ABSTRACT

A semiconductor device is provided. The semiconductor device includes a stacked field effect transistor (FET) structure. The stacked FET structure includes a bottom FET device, a top FET device overlying the bottom FET device, dielectric material interposed between the bottom FET device and the top FET device and a gate tie-down assembly of the top FET device extending through the bottom FET device.

12 Claims, 6 Drawing Sheets

(51) Int. Cl.

| | |
|---|---|
| ***H10D 84/85*** | (2025.01) |
| ***H10D 88/00*** | (2025.01) |
| ***H10W 20/41*** | (2026.01) |

(56) References Cited

U.S. PATENT DOCUMENTS

| | | | |
|---|---|---|---|
| 9,685,340 | B2 | 6/2017 | Ok et al. |
| 10,304,832 | B1 | 5/2019 | Chanemougame et al. |
| 10,607,938 | B1 | 3/2020 | Rubin et al. |
| 10,833,078 | B2 | 11/2020 | Smith et al. |
| 10,879,375 | B2 | 12/2020 | Fan et al. |
| 10,985,064 | B2 | 4/2021 | Zhang et al. |
| 12,080,608 | B2 * | 9/2024 | Lin ...................... H10D 84/038 |
| 2020/0075574 | A1 | 3/2020 | Smith et al. |
| 2022/0037497 | A1 | 2/2022 | Chung et al. |
| 2022/0093594 | A1 | 3/2022 | Song et al. |
| 2022/0181441 | A1 * | 6/2022 | Liebmann .......... H10D 84/0186 |
| 2023/0067311 | A1 * | 3/2023 | Lai ..................... H10D 84/0186 |
| 2023/0377985 | A1 * | 11/2023 | Smith .................. H10D 64/017 |

* cited by examiner

GATE TIE-DOWN FOR TOP FIELD EFFECT TRANSISTOR

BACKGROUND

The present invention generally relates to fabrication methods and resulting structures for semiconductor devices. More specifically, the present invention relates to a semiconductor device fabrication method to form a semiconductor device with a gate tie-down for a top field effect transistor (FET).

For the past several decades, the scaling of features in integrated circuits has been a driving force behind an ever-growing semiconductor industry. Scaling to smaller and smaller features enables increased densities of functional units on the limited real estate of semiconductor chips. For example, shrinking transistor size allows for the incorporation of an increased number of memory or logic devices on a chip, lending to the fabrication of products with increased capacity. The drive for the ever-increasing capacity, however, is not without issue. The necessity to optimize the performance of each device and each interconnect becomes increasingly significant.

SUMMARY

Embodiments of the invention are directed to a semiconductor device. A non-limiting example of the semiconductor device includes a stacked field effect transistor (FET) structure. The stacked FET structure includes a bottom FET device, a top FET device overlying the bottom FET device, dielectric material interposed between the bottom FET device and the top FET device and a gate tie-down assembly of the top FET device extending through the bottom FET device.

Embodiments of the present invention are directed to a semiconductor device. A non-limiting example of the semiconductor device includes a backside power rail and a stacked field effect transistor (FET) structure. The stacked FET structure includes a bottom FET device, a top FET device overlying the bottom FET device, dielectric material interposed between the bottom FET device and the top FET device and a gate tie-down assembly of the top FET device extending through the bottom FET device to connect to the backside power rail.

Embodiments of the present invention are directed to a semiconductor device fabrication method. A non-limiting example of the semiconductor device fabrication method includes forming a stack. The stack includes a bottom field effect transistor (FET) device, a top FET device overlying the bottom FET device and dielectric material interposed between the bottom FET device and the top FET device. The non-limiting example of the semiconductor device fabrication method further includes creating an opening through the stack, filling the opening with an outer core dielectric and an inner core dielectric, removing the inner core dielectric and a portion of the outer core dielectric to expose gate metal and portions of channels of the top FET device, forming inner spacers to isolate remainders of the channels and forming a backside power rail contact by metallizing space previously occupied by the inner core dielectric and the portion of the outer core dielectric.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

Figure 1:
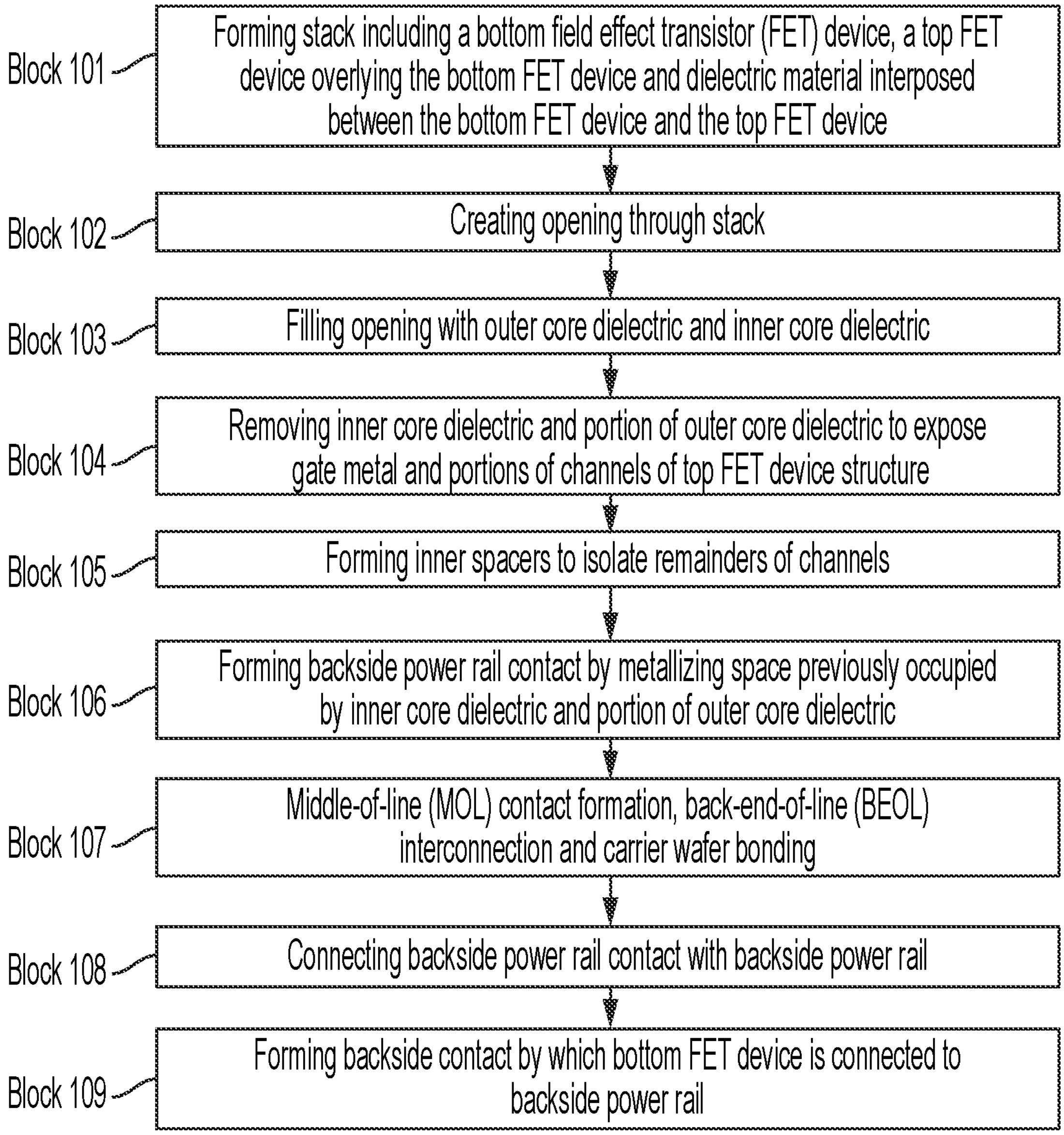
FIG. 1 is a flow diagram illustrating a method of semiconductor device fabrication in accordance with one or more embodiments of the present invention.

The diagrams depicted herein are illustrative. There can be many variations to the diagram or the operations described therein without departing from the spirit of the invention. For instance, the actions can be performed in a differing order or actions can be added, deleted or modified. Also, the term "coupled" and variations thereof describes having a communications path between two elements and does not imply a direct connection between the elements with no intervening elements/connections between them. All of these variations are considered a part of the specification.

In the accompanying FIGURES and following detailed description of the described embodiments, the various elements illustrated in the FIGURES are provided with two or three digit reference numbers. With minor exceptions, the leftmost digit(s) of each reference number correspond to the figure in which its element is first illustrated.

DETAILED DESCRIPTION

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

Turning now to an overview of technologies that are more specifically relevant to aspects of the invention, a field effect transistor (FET) typically has a source, a channel and a drain where current flows from the source to the drain as well as a gate that controls the flow of current through the device channel. FETs can have a variety of different structures. For example, FETs have been fabricated with the source, channel and drain formed in a substrate material itself, where the current flows horizontally (i.e., in the plane of the substrate). As another example, FinFETs have been formed with the channel extending outwardly from the substrate, but where the current also flows horizontally from the source to the drain. The channel for the FinFET can be an upright slab of thin rectangular silicon (Si), commonly referred to as the fin with a gate on the fin, as compared to a metal-oxide-semiconductor FET (MOSFET) with a single gate parallel with the plane of the substrate. Depending on doping of the source and drain, an n-doped FET (nFET) or a p-doped FET (pFET) can be formed. Two FETs also can be coupled to form a complementary metal-oxide-semiconductor (CMOS) device, where a p-channel MOSFET and n-channel MOSFET are coupled together.

In certain logic circuits in which FETs are employed, it is often the case that a stack of FETs is desired. In these or other cases, it is also often the case that gates for one or more of the FETs in the stack need to be tied down to a backside power delivery network (BSPDN). While providing a gate tie-down for a gate of a lower FET in a stack is relatively straightforward, this is not the case for the gate of an upper FET in a stack. Indeed, it has been found that providing a gate tie-down for an upper FET in a stack is actually quite difficult.

A need therefore remains for a semiconductor device including a stack of FETs to have a gate tie-down for an upper FET in the stack.

Turning now to an overview of the aspects of the invention, one or more embodiments of the invention address the above-described shortcomings of the prior art by providing a method of semiconductor device fabrication. The method includes forming stacked FETs, forming a gate cut region with a bi-layer dielectric fill, creating a contact opening for a backside power rail through inner core dielectric, forming a gate tie-down opening to remove a portion of a first spacer and, with the portion of the first spacer removed, connecting gate metal to the backside power rail through the contact opening.

The above-described aspects of the invention address the shortcomings of the prior art by providing for a semiconductor device that includes a stacked FET with one FET (the top FET) over another FET (the bottom FET) where gate metal of the top FET is provided with a gate tie-down to a backside power rail.

Turning now to a more detailed description of aspects of the present invention, FIG. 1 depicts a method of semiconductor device fabrication 100 according to one or more embodiments of the present invention.

As shown in FIG. 1, the method of semiconductor device fabrication 100 includes forming a stack of FET devices (block 101) where the stack of FET devices includes a bottom FET device, a top FET device overlying the bottom FET device and dielectric material interposed between the bottom FET device and the top FET device. The method of semiconductor device fabrication 100 further includes creating an opening through the stack (block 102), filling the opening with an outer core dielectric and an inner core dielectric (block 103), removing the inner core dielectric and a portion of the outer core dielectric to expose gate metal and portions of channels of the top FET device (block 104), forming inner spacers to isolate remainders of the channels (block 105) and forming a backside power rail contact by metallizing space previously occupied by the inner core dielectric and the portion of the outer core dielectric (block 106). The remainders of the outer core dielectric form dielectric spacers isolating the backside power rail contact from the bottom FET device.

In accordance with one or more embodiments of the present invention, the method of semiconductor device fabrication 100 further includes middle-of-line (MOL) contact formation, back-end-of-line (BEOL) interconnection and carrier wafer bonding (block 107), connecting the backside power rail contact with a backside power rail (block 108) and forming a backside contact by which the bottom FET device is connected to the backside power rail (block 109).

With reference to FIGS. 2-8B, the method of semiconductor device fabrication 100 of FIG. 1 will now be described in greater detail.

Figure 2:
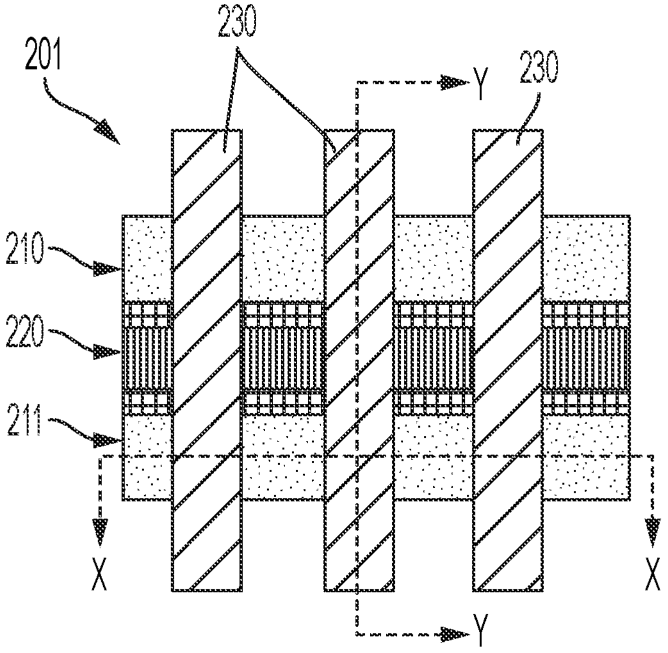
FIG. 2 depicts a top-down view of a semiconductor device according to one or more embodiments of the present invention.

FIG. 2 depicts a top-down view of semiconductor device 201 being fabricated and illustrates that the semiconductor device 201 will eventually include active regions 210, 211, a non-active region 220 interposed between the active regions 210, 211 and gates 230 spanning the active regions 210, 211. FIGS. 3-7 are cross-sectional views of varying stages of semiconductor device fabrication which correspond to line Y-Y of FIG. 2. FIG. 8A is a cross-sectional view of a final structure of a semiconductor device that corresponds to line X-X of FIG. 2. FIG. 8B is a cross-sectional view of a final structure of a semiconductor device that corresponds to line Y-Y of FIG. 2.

Figure 3:
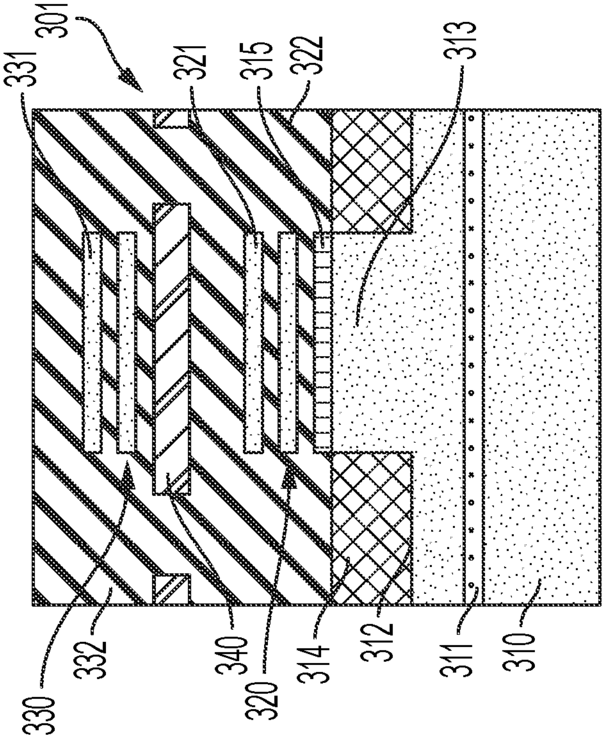
FIG. 3 is a side view of an initial structure of a semiconductor device in accordance with one or more embodiments of the present invention.

As shown in FIG. 3, an initial structure 301 of a semiconductor device is provided in accordance with one or more embodiments of the present invention. The initial structure 301 includes a semiconductor substrate 310, which is bisected by a semiconductor layer 311. In an exemplary case, the semiconductor substrate 310 can include silicon and the semiconductor layer 311 can include silicon germanium. The semiconductor substrate 310 has an uppermost surface 312 and a vertical fin 313 extending upwardly from the uppermost surface 312. The initial structure 301 further includes shallow trench isolation (STI) 314, which has an uppermost surface that is coplanar with an uppermost surface of the vertical fin 313, and bottom dielectric isolation (BDI) 315 overlying the uppermost surface of the vertical fin 313. The initial structure 301 also includes a bottom FET device 320, a top FET device 330 and dielectric material 340 interposed between the bottom FET device 320 and the top FET device 330. The bottom FET device 320 includes channels 321 of semiconductor material (e.g., silicon) and the gate metal of the high-k metal gate 322 surrounding the channels 321. The top FET device 330 includes channels 331 of semiconductor material (e.g., silicon) and the gate metal of the high-k metal gate 332 surrounding the channels 331.

The bottom FET device 320 and the top FET device 330 are both illustrated as gate-all-around (GAA) nanosheet (NS) FETs in FIG. 3. It is to be understood that this is not required and that other configurations of the bottom FET device 320 and the top FET device 330 are possible. However, for purposes of clarity and brevity, the following description will relate to the case of the bottom FET device 320 and the top FET device 330 both being configured as GAA NS FETs.

Figure 4:
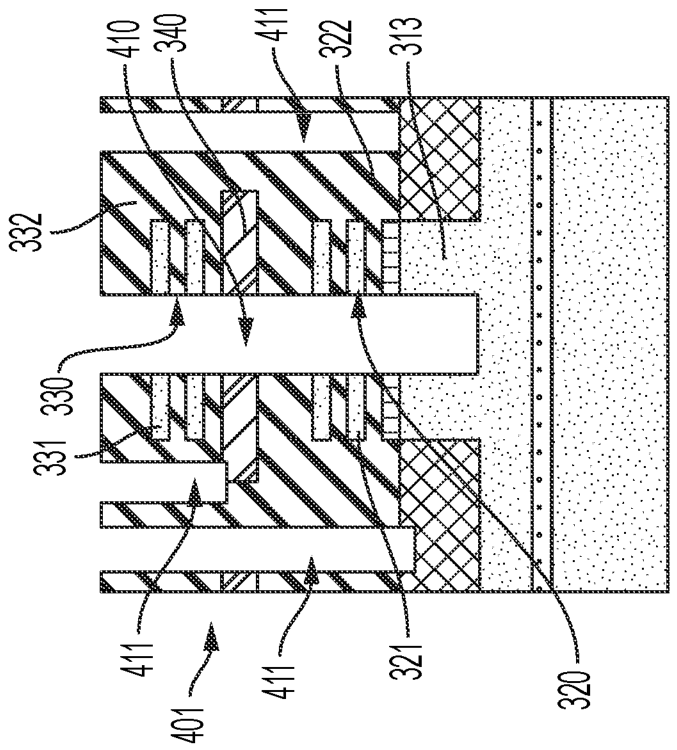
FIG. 4 is a side view of a first intermediate structure of a semiconductor device following gate cuts to form openings applied to the initial structure of FIG. 3 in accordance with one or more embodiments of the present invention.

As shown in FIG. 4, a first intermediate structure 401 of a semiconductor device is provided and results from gate cut openings being created in the initial structure 301 of FIG. 3. The gate cut openings include a main opening 410 and additional openings 411. The main opening 410 extends through the top FET device 330, the dielectric material 340 and the bottom FET device 320 to the vertical fin 313. Within the top FET device 330, the main opening 410 extends through the gate metal of the high-k metal gate 332 and the semiconductor channels 331 and thus exposes interior surfaces of the gate metal of the high-k metal gate 332 and interior surfaces of the semiconductor channels 331. Within the bottom FET device 320, the main opening 410 extends through the gate metal of the high-k metal gate 322 and the semiconductor channels 321 and thus exposes interior surfaces of the gate metal of the high-k metal gate 322 and interior surfaces of the semiconductor channels 321.

Figure 5:
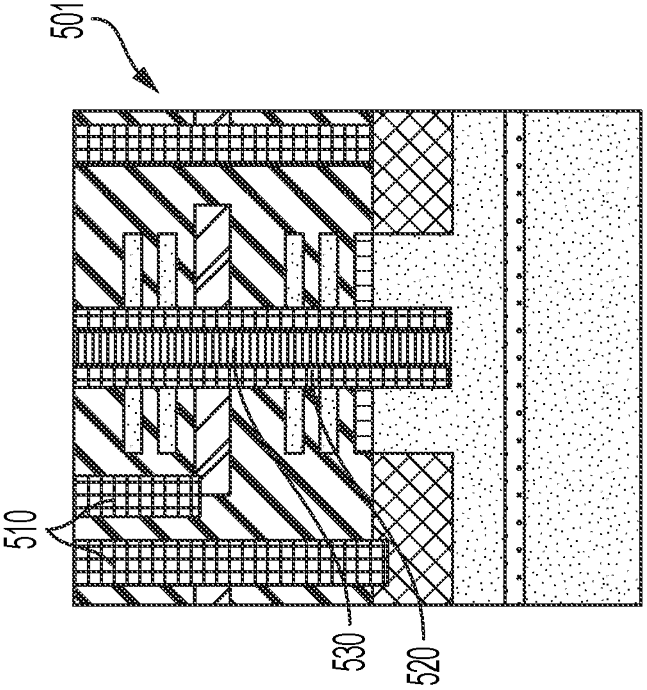
FIG. 5 is a side view of a second intermediate structure of a semiconductor device following filling operations applied to the first intermediate structure of FIG. 4 in accordance with one or more embodiments of the present invention.

As shown in FIG. 5, a second intermediate structure 501 of a semiconductor device is provided following filling operations applied to the first intermediate structure 401 of FIG. 4. The filling operations result in a nitride-based fill 510 of the additional openings 411 (see FIG. 4), the formation of a nitride-based outer core dielectric 520 in a periphery of the main opening 410 (see FIG. 4) and the formation of an oxide-based inner core dielectric 530 in a center of the main opening 410 (see FIG. 4).

It is to be understood that the nitride-based outer core dielectric 520 and the oxide-based inner core dielectric 530 are merely exemplary and that other material options can be employed to similar effect. As a further example, the outer core dielectric 520 can be oxide-based and the inner core dielectric 430 can be nitride-based.

Figure 6:
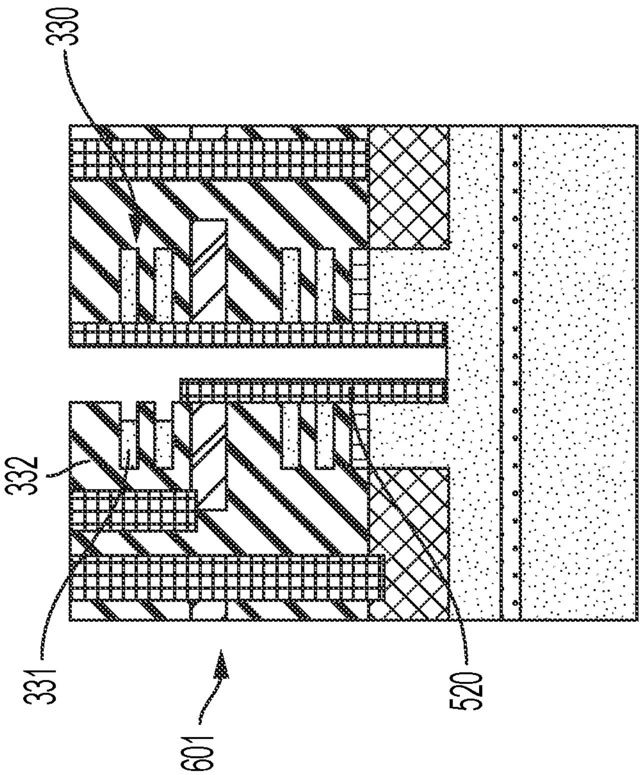
FIG. 6 is a side view of a third intermediate structure of a semiconductor device following removal of dielectric filler material and portions of top FET channels applied to the second intermediate structure of FIG. 5 in accordance with one or more embodiments of the present invention.

As shown in FIG. 6, a third intermediate structure 601 of a semiconductor device is provided. The third intermediate structure 601 results from material removal operations applied to the second intermediate structure 501 of FIG. 5. The material removal operations include removal of the inner core dielectric 530 (see FIG. 5) using a mask, removal of a portion of the outer core dielectric 520 to expose a corresponding portion of the gate metal of the high-k metal gate 332 of the top FET device 330 and to also expose corresponding portions of the channels 331 of the top FET device 330 and removal of semiconductor material from those portions of the channels 331 that are exposed using another mask. The removal of the portion of the outer core dielectric 520 can be executed by use of organic polymer layer (OPL) ash and gate tie-down patterning followed by exposed spacer removal. The removal of the semiconductor material from those portions of the channels 331 that are exposed can be executed by silicon indentation processing. The silicon indentation processing is followed by removal of the OPL ash.

Figure 7:
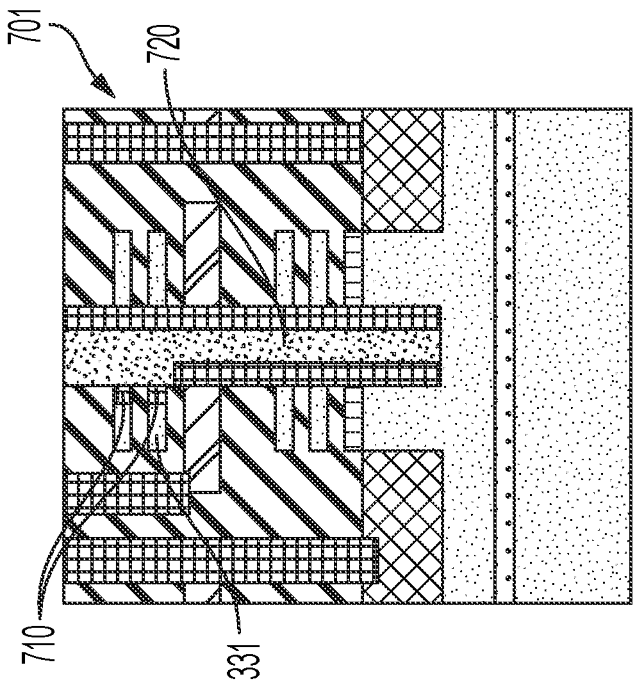
FIG. 7 is a side view of a fourth intermediate structure of a semiconductor device following metallization applied to the third intermediate structure of FIG. 6 in accordance with one or more embodiments of the present invention.
Figures 8A, 8B:
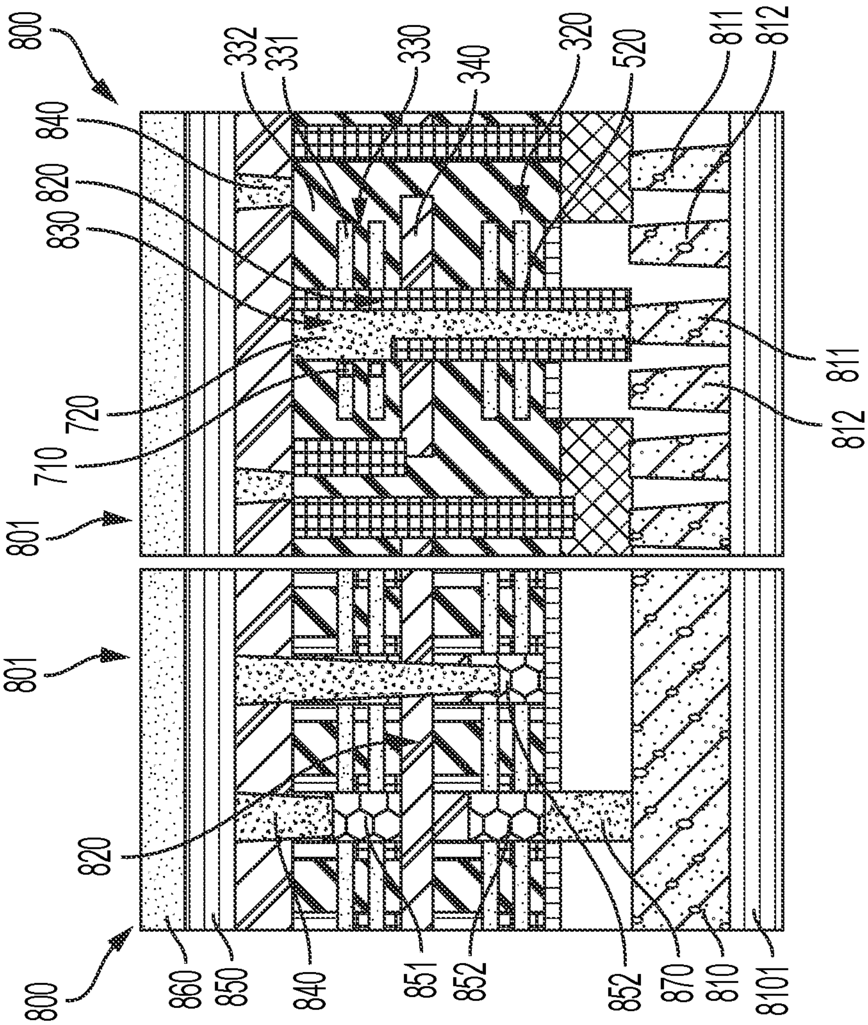
FIGS. 8A and 8B are side views of a final structure of a semiconductor device following middle-of-line (MOL) contact formation, back-end-of-line (BEOL) interconnection, carrier wafer bonding, connecting of a backside power rail contact with a backside power rail and forming of a backside contact applied to the fourth intermediate structure of FIG. 7 in accordance with one or more embodiments of the present invention.

As shown in FIG. 7, a fourth intermediate structure 701 of a semiconductor device is provided following inner spacer formation and metallization applied to the third intermediate structure 601 of FIG. 6. The inner spacer formation forms inner spacers 710 to isolate semiconductor material of remainders of the channels 331. The metallization forms a backside power rail contact 720 by metallizing space previously occupied by the inner core dielectric 530 (see FIG. 5), which was removed entirely, and the portion of the outer core dielectric 520 (see FIG. 5) that was removed.

As shown in FIGS. 8A and 8B, a final structure 801 of a semiconductor device 800 is provided following middle-of-line (MOL) contact formation, back-end-of-line (BEOL) interconnection, carrier wafer bonding, connecting of a backside power rail contact with a backside power rail and forming of a backside contact applied to the fourth intermediate structure 701 of FIG. 7.

The semiconductor device 800 thus includes a backside power rail 810, a backside power delivery network 8101 and a stacked FET structure 820. The stacked FET structure 820 includes the bottom FET device 320, the top FET device 330 overlying the bottom FET device 320, dielectric material 340 interposed between the bottom FET device 320 and the top FET device 330 and a gate tie-down assembly 830 of the top FET device 330. The top FET device 330 includes channels 331 of semiconductor material and gate metal of the high-k metal gate 332 surrounding the channels 331. The gate tie-down assembly 830 extends from the gate of the top FET device 330, through the dielectric material 340 and through the bottom FET device 320 to connect to the backside power rail 810.

The gate tie-down assembly 830 includes the backside power rail contact 720, which is formed of conductive material, and which is disposed in contact with the gate metal of the gate metal of the high-k metal gate 332 of the top FET device 330 and the backside power rail 810. The gate tie-down assembly 830 further includes the remainders of the outer core dielectric 520 acting as dielectric spacers isolating the conductive material 831 from the bottom FET device 320 and the inner spacers 710. The inner spacers 710 isolate the conductive material of the backside power rail contact 720 from the semiconductor material of the channels 321.

The backside power rail 810 can include multiple types of contact leads 811 (e.g., VDD) and 812 (VSS) with the gate tie-down assembly 830 being connectable with each of the multiple types of contact leads 811 and 812. The semiconductor device 800 can further include MOL contacts 840 resulting from the middle-of-line (MOL) contact formation, a BEOL layer 850, which is connected to and communicative with S/D epitaxy 851 of the top FET device 330 and with S/D epitaxy 852 of the bottom FET device 320 by way of the MOL contacts 840, and a carrier wafer 860. In addition, the semiconductor device 800 can also include a backside contact 870 by which the S/D epitaxy 852 of the bottom FET device 320 is connected to and communicative with the backside power rail 810.

Various embodiments of the present invention are described herein with reference to the related drawings. Alternative embodiments can be devised without departing from the scope of this invention. Although various connections and positional relationships (e.g., over, below, adjacent, etc.) are set forth between elements in the following description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer “A” over layer “B” include situations in which one or more intermediate layers (e.g., layer “C”) is between layer “A” and layer “B” as long as the relevant characteristics and functionalities of layer “A” and layer “B” are not substantially changed by the intermediate layer(s).

The following definitions and abbreviations are to be used for the interpretation of the claims and the specification. As used herein, the terms “comprises,” “comprising,” “includes,” “including,” “has,” “having,” “contains” or “containing,” or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term “exemplary” is used herein to mean “serving as an example, instance or illustration.” Any embodiment or design described herein as “exemplary” is not necessarily to be construed as preferred or advantageous over other embodiments or designs. The terms “at least one” and “one or more” are understood to include any integer number greater than or equal to one, i.e. one, two, three, four, etc. The terms “a plurality” are understood to include any integer number greater than or equal to two, i.e. two, three, four, five, etc. The term “connection” can include an indirect “connection” and a direct “connection.”

References in the specification to “one embodiment,” “an embodiment,” “an example embodiment,” etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms “upper,” “lower,” “right,” “left,” “vertical,” “horizontal,” “top,” “bottom,” and derivatives thereof shall relate to the described structures and methods, as oriented in the drawing FIGURES. The terms “overlying,” “atop,” “on top,” “positioned on” or “positioned atop” mean that a first element, such as a first structure, is present on a second element, such as a second structure, wherein intervening elements such as an interface structure can be present between the first element and the second element. The term “direct contact” means that a first element, such as a first structure, and a second element, such as a second structure, are connected without any intermediary conducting, insulating or semiconductor layers at the interface of the two elements.

Spatially relative terms, e.g., “beneath,” “below,” “lower,” “above,” “upper,” and the like, can be used herein for ease of description to describe one element or feature’s relationship to another element(s) or feature(s) as illustrated in the FIGURES. It will be understood that the spatially relative terms are intended to encompass different orientations of the device in use or operation in addition to the orientation depicted in the FIGURES. For example, if the device in the FIGURES is turned over, elements described as “below” or “beneath” other elements or features would then be oriented “above” the other elements or features. Thus, the term “below” can encompass both an orientation of above and below. The device can be otherwise oriented (rotated 90 degrees or at other orientations) and the spatially relative descriptors used herein interpreted accordingly.

The phrase “selective to,” such as, for example, “a first element selective to a second element,” means that the first element can be etched and the second element can act as an etch stop.

The terms “about,” “substantially,” “approximately,” and variations thereof, are intended to include the degree of error associated with measurement of the particular quantity based upon the equipment available at the time of filing the application. For example, “about” can include a range of ±8% or 5%, or 2% of a given value.

The term “conformal” (e.g., a conformal layer) means that the thickness of the layer is substantially the same on all surfaces, or that the thickness variation is less than 15% of the nominal thickness of the layer.

The terms “epitaxial growth and/or deposition” and “epitaxially formed and/or grown” mean the growth of a semiconductor material (crystalline material) on a deposition surface of another semiconductor material (crystalline material), in which the semiconductor material being grown (crystalline overlayer) has substantially the same crystalline characteristics as the semiconductor material of the deposition surface (seed material). In an epitaxial deposition process, the chemical reactants provided by the source gases can be controlled and the system parameters can be set so that the depositing atoms arrive at the deposition surface of the semiconductor substrate with sufficient energy to move about on the surface such that the depositing atoms orient themselves to the crystal arrangement of the atoms of the deposition surface. An epitaxially grown semiconductor material can have substantially the same crystalline characteristics as the deposition surface on which the epitaxially grown material is formed. For example, an epitaxially grown semiconductor material deposited on a {100} orientated crystalline surface can take on a {100} orientation. In some embodiments of the invention, epitaxial growth and/or deposition processes can be selective to forming on semiconductor surface, and cannot deposit material on exposed surfaces, such as silicon dioxide or silicon nitride surfaces.

As previously noted herein, for the sake of brevity, conventional techniques related to semiconductor device and integrated circuit (IC) fabrication may or may not be described in detail herein. By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), and chemical-mechanical planarization (CMP), and the like. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

The flowchart and block diagrams in the Figures illustrate possible implementations of fabrication and/or operation methods according to various embodiments of the present invention. Various functions/operations of the method are represented in the flow diagram by blocks. In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A semiconductor device, comprising:

a stacked field effect transistor (FET) structure comprising:

a bottom FET device;

a top FET device overlying the bottom FET device and comprising semiconductor channels and gate metal surrounding the semiconductor channels;

dielectric material interposed between the bottom FET device and the top FET device; and a gate tie-down assembly of the top FET device extending through the bottom FET device, the gate tie-down assembly comprising conductive material in contact with the gate metal of the top FET device, dielectric spacers isolating the conductive material from the bottom FET device and inner spacers isolating the conductive material from the semiconductor channels.

2. The semiconductor device according to claim 1, further comprising a backside power rail to which the gate tie-down assembly is connected.

3. The semiconductor device according to claim 2, wherein:

the backside power rail comprises multiple types of contact leads, and the gate tie-down assembly is connectable with each of the multiple types of contact leads.

4. The semiconductor device according to claim 2, further comprising a backside contact by which the bottom FET device is connected to the backside power rail.

5. A semiconductor device, comprising:

a backside power rail; and a stacked field effect transistor (FET) structure comprising:

a bottom FET device;

a top FET device overlying the bottom FET device and comprising semiconductor channels and gate metal surrounding the semiconductor channels;

dielectric material interposed between the bottom FET device and the top FET device; and a gate tie-down assembly of the top FET device extending through the bottom FET device to connect to the backside power rail, the gate tie-down assembly comprising conductive material in contact with the gate metal of the top FET device, dielectric spacers isolating the conductive material from the bottom FET device and inner spacers isolating the conductive material from the semiconductor channels.

6. The semiconductor device according to claim 5, wherein:

the backside power rail comprises multiple types of contact leads, and the gate tie-down assembly is connectable with each of the multiple types of contact leads.

7. The semiconductor device according to claim 5, further comprising a backside contact by which the bottom FET device is connected to the backside power rail.

8. A semiconductor device fabrication method, comprising:

forming a stack comprising a bottom field effect transistor (FET) device, a top FET device overlying the bottom FET device and dielectric material interposed between the bottom FET device and the top FET device;

creating an opening through the stack;

filling the opening with an outer core dielectric and an inner core dielectric;

removing the inner core dielectric and a portion of the outer core dielectric to expose gate metal and portions of channels of the top FET device;

forming inner spacers to isolate remainders of the channels; and forming a backside power rail contact by metallizing space previously occupied by the inner core dielectric and the portion of the outer core dielectric.

9. The semiconductor device fabrication method according to claim 8, wherein the remainders of the outer core dielectric form dielectric spacers isolating the backside power rail contact from the bottom FET device.

10. The semiconductor device fabrication method according to claim 8, further comprising middle-of-line (MOL) contact formation, back-end-of-line (BEOL) interconnection and carrier wafer bonding.

11. The semiconductor device fabrication method according to claim 8, further comprising connecting the backside power rail contact with a backside power rail.

12. The semiconductor device fabrication method according to claim 11, further comprising forming a backside contact by which the bottom FET device is connected to the backside power rail.

* * * * *